(12) United States Patent
Tischner et al.

(10) Patent No.: US 7,460,704 B2
(45) Date of Patent: Dec. 2, 2008

(54) DEVICE FOR STABILIZING A WORKPIECE DURING PROCESSING

(75) Inventors: Wolfgang Tischner, Villach (AT); Carsten Von Koblinski, Villach (AT)

(73) Assignee: Infineon Technologies AG, Munich (DE)

( * ) Notice: Subject to any disclaimer, the term of this patent is extended or adjusted under 35 U.S.C. 154(b) by 137 days.

(21) Appl. No.: 11/418,659

(22) Filed: May 5, 2006

(65) Prior Publication Data

US 2006/0266718 A1 Nov. 30, 2006

(30) Foreign Application Priority Data

May 6, 2005 (DE) .................. 10 2005 021 048

(51) Int. Cl.
*G06K 9/00* (2006.01)
(52) U.S. Cl. .................. 382/152; 382/151; 382/152
(58) Field of Classification Search .................. 382/151, 382/152; 438/459
See application file for complete search history.

(56) References Cited

U.S. PATENT DOCUMENTS

| 3,843,916 | A | | 10/1974 | Trotel et al. |
| 5,881,165 | A | * | 3/1999 | Tanaka ........................ 382/151 |
| 6,827,809 | B2 | * | 12/2004 | Anker ......................... 156/249 |
| 6,864,182 | B2 | | 3/2005 | Butschke et al. |
| 2003/0003739 | A1 | * | 1/2003 | Butschke et al. ............ 438/689 |

FOREIGN PATENT DOCUMENTS

| DE | 196 52 376 A1 | 6/1998 |
| DE | 101 31 139 A1 | 1/2003 |

\* cited by examiner

*Primary Examiner*—Walter Lindsay, Jr.
*Assistant Examiner*—Abdulfattah Mustapha
(74) *Attorney, Agent, or Firm*—Brinks Hofer Gilson & Lione

(57) ABSTRACT

A device that stabilizes a workpiece during processing includes a first workpiece carrier part, a second work piece carrier part, and a fixing unit that mutually fixes the workpiece carrier parts in such a way that the workpiece is held between the first and-second workpiece carrier parts. The first workpiece carrier part has a patterned mask. In this way, the production costs can be significantly reduced particularly in the case of workpieces at risk of fracture.

21 Claims, 5 Drawing Sheets

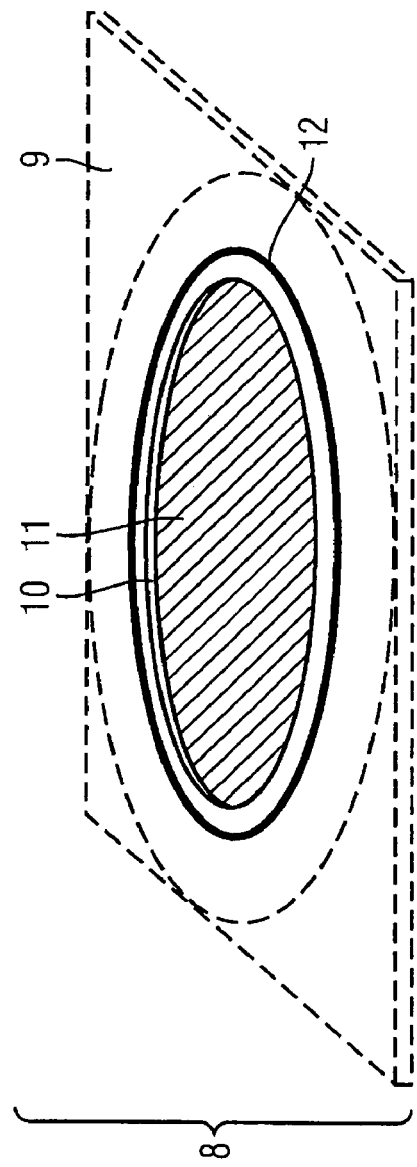 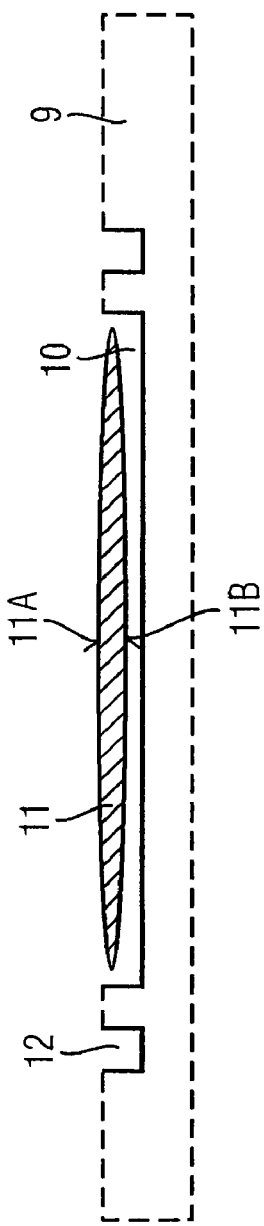
FIG 1A
FIG 1B

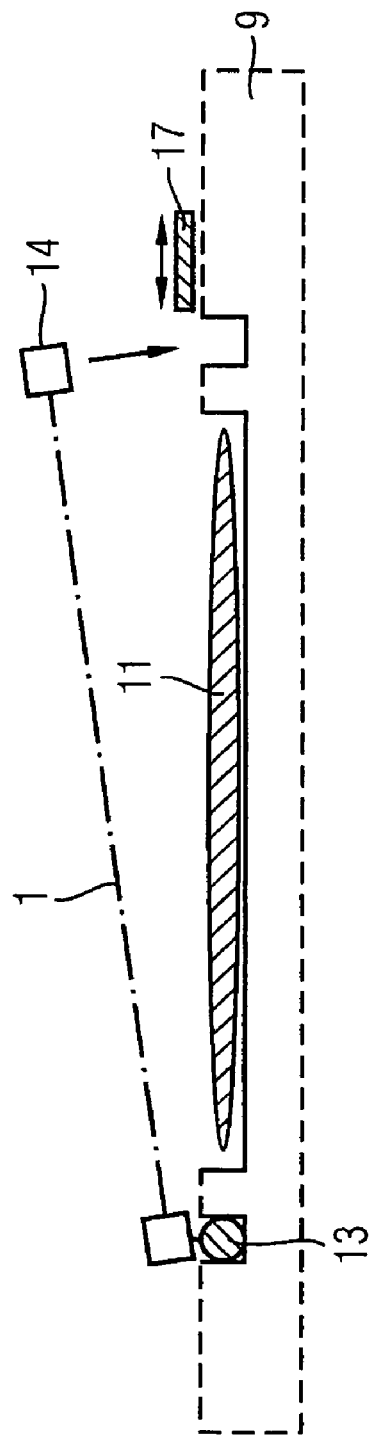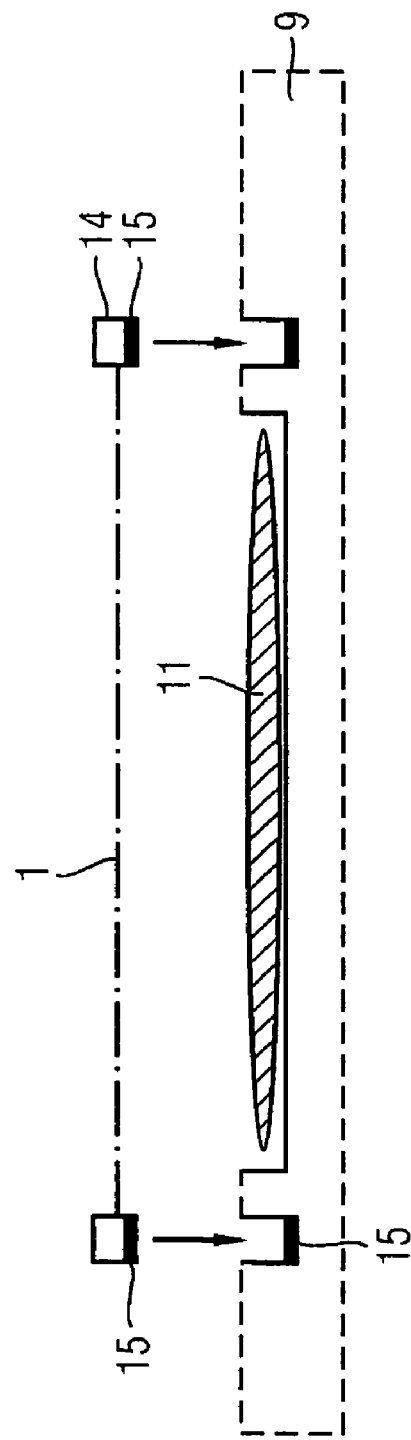

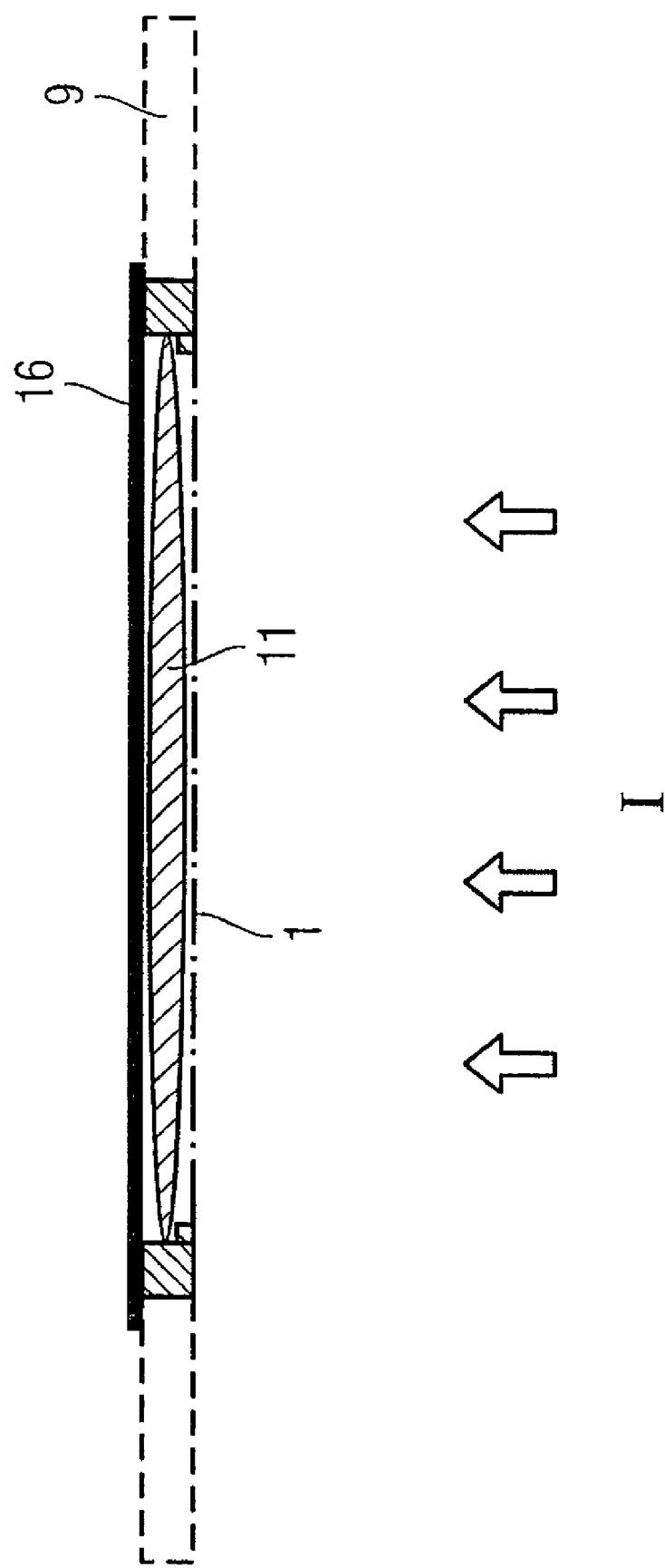

DEVICE FOR STABILIZING A WORKPIECE DURING PROCESSING

PRIORITY CLAIM

This application claims the benefit of priority from German Patent Application No. DE 10 2005 021 048.1, filed May 6, 2005 which is incorporated herein by reference in its entirety.

BACKGROUND

1. Technical Field

The disclosure relates to a device that stabilizes a workpiece during processing, and in particular to a device that stabilizes very thin semiconductor wafers or thin wafers for realizing a patterned rear side implantation of the thin wafer.

2. Background Information

For applications of electronic components, and in particular of integrated circuits (ICs) it is advantageous to restrict the total thickness of the integrated circuits or semiconductor circuits to a few micrometers. Such thin semiconductor circuits or semiconductor chips have a very small mass and a very small structural height, so they are of importance for many fields of application, such as in future disposable electronics and for chip cards and smart cards.

Such thin semiconductor circuits may be produced from so called thin wafers or ultra thin semiconductor wafers, semiconductor wafers of normal thickness with an initial thickness of approximately 500 to 1000 μm being thinned by grinding to a corresponding thickness after the production or a partial processing of respective semiconductor components.

However, since thicknesses of significantly less than 200 μm are desirable for future semiconductor components, and furthermore, in particular, two-sided processing may be required for forming semiconductor components processed on both sides, a significant problem in producing ultra thin semiconductor circuits consists in avoiding a fracture of the thin wafers or ultra thin semiconductor wafers.

Particularly in the production of new types of semiconductor components such as, e.g., light metal oxide semiconductor (MOS), insulated gate bipolar transistors (IGBTs), IGBT resistor-capacitor RC, or other devices, fundamental changes are required in the process sequences required in the processing of thin wafers. A central process in this so called thin wafer technology is a rear side processing of the thin wafer and in particular a rear side implantation for targeted setting of electrical parameters for the finished component or the final semiconductor circuit.

Two problems, in particular, may occur during the implantation of thin wafers or ultra thin semiconductor wafers using apparatuses that have been commercially available heretofore. The mechanical stability, in particular an edge stability of the thin wafers, is so low that in the case of apparatuses based on a rotation principle, on account of the centrifugal forces that result, wafer fractures or instances of wafer edge damage occur to an increased extent. These result essentially from the mechanical edge loading and the mechanical wafer holding devices. Secondly, the thin wafers, in particular at the stage of a high degree of r processing, that is to say that the semiconductor circuit is almost completed, form such a bow that in the case of implantation apparatuses based on electrostatic holding devices, it is not possible to ensure sufficient adhesion during the implantation.

Furthermore, there is increasingly the need for a patterned processing and in particular for a patterned implantation, in particular, of a rear side of the thin wafer in which only specific regions of the semiconductor wafer are processed or implanted.

Conventional devices and methods for carrying out a patterned processing of semiconductor wafers are generally known, in particular in the processing of wafers of normal thickness or so called thick wafers. In this case, a layer of photoresist is applied on the semiconductor wafer and the regions to be processed or implanted are uncovered by a photolithographic patterning. After the processing or implantation, the photoresist is removed again by wet chemical and/or dry chemical means. A conventional method of this type brings about a large number of problems, however, in the case of thin wafers and in particular when using very high implantation doses of $>1 \cdot 10^{15}/cm^2$.

The number of process steps and the associated additional handling of the thin wafers are significantly increased because of the photolithographic patterning used. Consequently, at least four process steps are required for a conventional photopatterning (resist coating, exposure, development, resist stripping), and further process steps such as e.g. inspection, or resist curing may possibly be added. Experience shows that each additional process step, particularly in the case of thin wafer technology, leads to increased edge damage and ultimately to wafer fracture.

Furthermore, in particular during implantation with very high doses of $>1 \cdot 10^{15}/cm^2$, on account of thermal and chemical conversion processes of the photoresist as a result of the bulk implantation, considerable problems arise in removing the so called "cracked" photoresist again from the surface of the thin wafer, for which reason at the present time recourse is had to the so called "double resist technique", in which two or more layers of photoresist are used so that the photoresist layer which is applied directly to the silicon wafer is protected against the "harmful" influence of the implantation and is obtained such that it can be removed by the abovementioned methods (wet chemical and/or dry chemical etching process).

BRIEF SUMMARY

A device that stabilizes a workpiece during processing includes a first workpiece carrier part, a second work piece carrier part, and a fixing unit that mutually fixes the workpiece carrier parts in such a way that the workpiece is held between the first and-second workpiece carrier parts. The first workpiece carrier part has a patterned mask. In this way, the production costs can be significantly reduced particularly in the case of workpieces at risk of fracture.

BRIEF DESCRIPTION OF THE DRAWINGS

FIGS. 1A and 1B show a perspective view and an associated sectional view of a workpiece carrier part of the stabilization device.

FIG. 3 shows a sectional view of the stabilization device.

FIG. 4 shows a sectional view of the stabilization device.

FIG. 5 shows a sectional view of a stabilization device.

DETAILED DESCRIPTION OF THE DRAWINGS

The disclosure describes a patterned ion implantation in the case of ultra thin semiconductor wafers or thin wafers, which are also referred to as workpiece hereinafter. Other processing forms such as, for example, a patterned deposition of layers by means of sputtering methods or the like are also conceivable in principle.

FIG. 1A shows a perspective view of a workpiece carrier part 8 such as is used for the stabilization of a very thin workpiece, and in particular of an ultra thin semiconductor wafer or thin wafer 11. FIG. 1B shows an associated sectional view of the workpiece carrier part illustrated in FIG. 1A with a workpiece 11 placed thereon.

Figure 6:
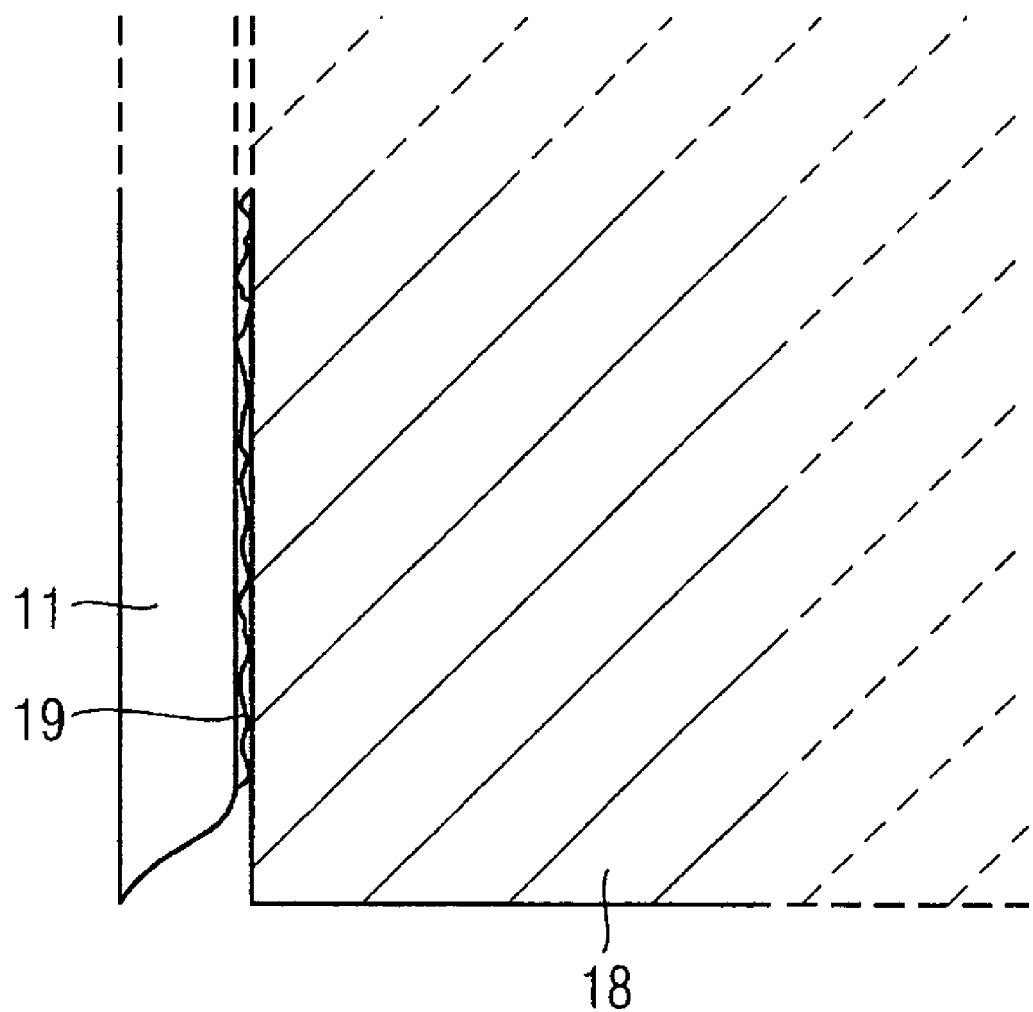
FIG. 6 shows a partial sectional view of an edge region of the workpiece or carried thin wafer to be stabilized.

The workpiece 11 may be, in accordance with FIG. 6, a thin wafer 11 that is carried or held on a carrier wafer 18, or alternatively a thin wafer that is not carried. At the beginning of the processing, the thin wafer 11 usually comprises a semiconductor wafer of normal thickness, such as a thickness of approximately 700 µm, and in, particular a Si semiconductor wafer. After the preparatory steps for thinning, the thin wafer 11 usually has the desired thickness of $\leq 140$ µm. Since such thin wafers 11 are very difficult to handle, they may be fixed on the carrier wafer 18 by a connecting medium 19 such as, for example, an adhesive film or some other adhesive. The carrier wafer may constitute a semiconductor wafer of normal thickness with the same dimensions. Although a carried thin wafer of this type is significantly more stable than a thin wafer that is not carried, instances of edge damage can nevertheless occur because of undercuts that occur during a concluding etching step, in an edge region or peripheral region. These instances of wafer edge damage may arise in the course of handling, e.g. tilting, of the carried thin wafer.

Therefore, a device for stabilizing such noncarried or carried thin wafers 11 is proposed according to the invention, the workpiece to be processed or the thin wafer being held between a first and second workpiece carrier part in such a way that no or only small mechanical forces act on the edge or peripheral regions of the workpiece or thin wafer. Furthermore, one of the workpiece carrier parts has a patterned mask which can be used to carry out a patterned processing of a rear-side surface of the workpiece or thin wafer simultaneously without carrying out cost-intensive photoresist methods.

In accordance with FIGS. 1A and 1B, a workpiece carrier part 8 has a carrier plate 9, the diameter of which is identical in magnitude or larger and which may include, for example, metallic materials, a ceramic or plastic. Preferably, the carrier plate 9 essentially has the form of the workpiece or thin wafer 11 to be received, but it may also have forms deviating therefrom, such as, for example, the rectangular form illustrated in FIG. 1A.

Furthermore, the workpiece carrier part 8 may have a depression 10 for receiving the workpiece or thin wafer 11 to be processed, which in turn preferably has the form of the thin wafer 11 to be received and, with regard to its diameter, should be larger than, the diameter of the thin wafer 11 in order to reliably prevent contact and hence mechanical loading of the edge regions or peripheral regions of the thin wafer 11. The depth of the depression 10 may be chosen in such a way that when the thin wafer or carried thin wafer 11 is deposited in the depression 10, it projects slightly from the depression for subsequent mounting of a further workpiece carrier part, to enable a reliable fixing in particular by the opposite main surfaces 11A and 11B of the thin wafer 11.

Furthermore, the workpiece carrier part 8 may have a further depression 12 for receiving the further workpiece carrier part. For processing in standard process apparatuses, workpiece carrier parts 8 in the form of 8 inch wafers are used for example for 6 inch thin wafers. In this way, it is possible to use all already existing apparatuses and in particular high-energy implantation apparatuses.

Figure 2A:
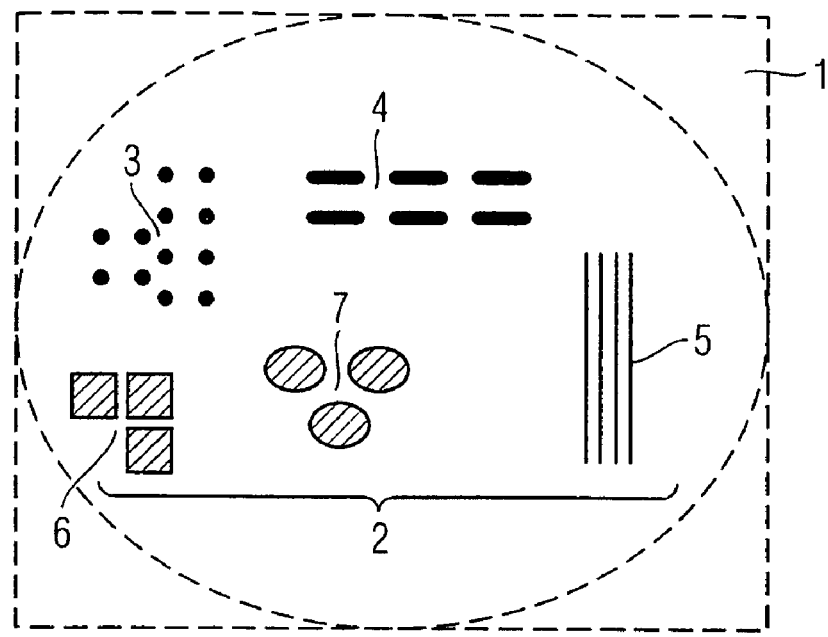
FIGS. 2A and 2B show a plan view and an associated sectional view of an associated further workpiece carrier part of the stabilization device.

FIG. 2A shows a plan view of a patterned mask 1 such as may be placed in particular as a stencil mask film for a high-energy ion implantation in particular for realizing a rear-side processing of the thin wafer 11 onto the workpiece carrier part 8 and the thin wafer 11, whereby a so-called sandwich structure arises. In this case, the patterned mask 1 may be fixed on the workpiece carrier part 8 by a fixing unit in such a way that the thin wafer 11 is held only at its opposite main surfaces 11A and 11B.

Since the thin wafer 11 is usually a semiconductor wafer that has been almost completely completed or processed and when it is merely necessary to carry out a processing of a rear side and in particular a patterned implantation for completing the semiconductor components formed in the semiconductor crystal, the patterned mask may have corresponding openings 2 through which an implantation and also a deposition are at least partially made possible.

The openings 2 in the patterned mask 1 may in this case be punctiform 3, slotted 4, linear 5, rectangular 6, round or oval 7, or have some other form, with regard to a plan view. New types of semiconductor components such as, for example, so-called light-MOS, IGBTs, IGBT-RC, which for example have a diode on their rear side, can thus be directly patterned and completed.

Figure 2B:
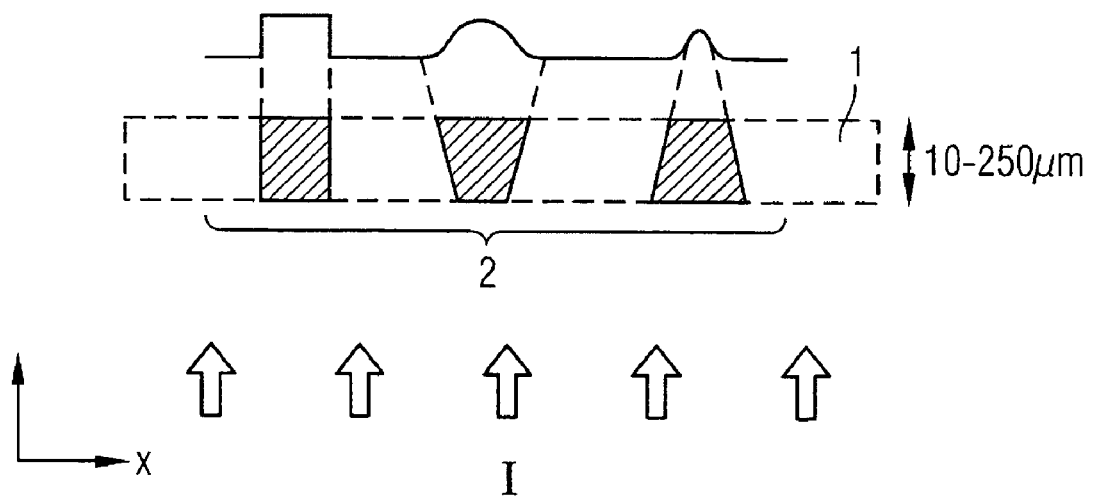

FIG. 2B shows a simplified sectional view of the patterned mask film 1, where the openings 2 for realizing a 1:1 imaging may have a rectangular structure. In this case, a doping profile that is likewise illustrated is transferred into the semiconductor material of the thin wafer essentially in rectangular fashion. Furthermore, however, there may also be requirements made of a semiconductor circuit and in particular the doping profiles thereof, a diffused or focused doping profile being desired in the semiconductor crystal. In these cases, in accordance with FIG. 2B, openings 2 in truncated cone form may also be provided, an inlet opening being smaller than an outlet opening for the purpose of diffusion or divergence of the doping profile (relative to an implantation direction I), while an inlet opening is larger than an outlet opening for the purpose of focusing or for the purpose of densifying the doping profile. Consequently, a wide variety of types of doping profiles can be realized through the use of different cross-sectional forms of the openings 2 to 5 in the patterned mask 1.

The stencil mask film 1 may include a high-grade steel sheet which has a thickness of approximately 50 micrometers and into which the abovementioned openings 2 are produced by mechanical processing by lasers, drilling, or milling or else by chemical processing such, as etching. In principle, however, the thickness of this patterned mask may lie in a range of 10 to 250 µm and furthermore, also have alternative materials. Accordingly, alloys, ceramic materials and/or plastics such as polyimide, polyacrylic or Plexiglas are also conceivable besides the preferred-high-grade steel.

Although the patterned mask film 1 in accordance with FIGS. 2A and, 2B may in principle also be applied and fixed directly on the workpiece carrier part 8 in accordance with FIGS. 1A and 1B, in the case of the stabilization device actually used, in particular for realizing automatic component mounting, use is made of so-called supporting elements and in particular supporting rings 14 for carrying the patterned mask 1, which can then be introduced into the second depressions 12 provided in accordance with FIGS. 1A and 1B.

FIGS. 3 to 5 show sectional views for preferred stabilization devices. In accordance with FIG. 3, the patterned mask film 1 is accordingly carried or clamped by an annular supporting element 14, which furthermore enables a fixing with the workpiece carrier part 8 or the carrier plate 9 thereof. To put it more precisely, in accordance with FIG. 3, a fixing may be realized for example by a folding device with an articulation 13 on one side, where the articulation is fitted and fixed in an articulation section of the supporting ring depression 12 and enables the supporting ring 14 to be pivoted in particular into the annular groove or depression 12. Furthermore, a mechanical locking element 17 may be arranged at a region opposite to the articulation 13, where the locking element locks the supporting ring 14 mechanically on the carrier plate 9 or connects the first workpiece carrier part, including the mask film 1 and supporting ring 14, to the second workpiece carrier part, including the carrier plate 9, in such a way that the thin wafer or carried thin wafer 11 is held between the first and second workpiece carrier parts. As a result, a mechanical loading of the particularly sensitive edge or peripheral regions of the thin wafer 11 can be reliably precluded and at the same time a patterned processing of the thin wafer 11 can be effected by the mask film 1 acting as part of the stabilization device. Significant cost savings result in this case in particular for a rear-side implantation.

Since the stabilization device preferably has the form of a next larger wafer, this stabilization device not only protects the wafer edge from mechanical, apparatus-internal or other clamping devices but can furthermore also be used for holding systems embodied in electrostatic fashion. Furthermore, the production costs are also reduced by the reduced number of photoplanes since at least one photoplane is obviated in the case of the stabilization device. Customary problems with so-called "cracked" photoresists which would normally have to be solved by the so-called double resist technique may also be avoided in the same way.

FIG. 4 shows a sectional view of a stabilization device, identical reference symbols designating elements that are identical or correspond to those in FIGS. 1 to 3, for which reason a repeated description is dispensed with below. In accordance with FIG. 4, instead of, the articulation 13, the mask film I is introduced directly into the receiving depression 12 by its supporting ring 14. In this case, in contrast to the mechanical fixing by the articulation 13 and the mechanical locking by the locking element 17, a fixing takes place by means of magnet elements 15 integrated in the supporting ring 14 and the depression 12, where the magnet elements enable a sufficient fixing or adhesion of the patterned mask 1 on the carrier plate 9.

Combinations of the example stabilization devices mentioned above are also conceivable, by way of example the magnet elements 15 being replaced by the locking elements 17 or an articulation 13 being combined with a magnet fixing 15. Furthermore, magnet elements are also conceivable which are situated in the basic body of the carrier plate 9 below the thin wafer 11 and press the mask film 1 comprising high-grade steel onto the main surface of the thin wafer without the use of the supporting rings 14.

FIG. 5 shows a simplified sectional view of a stabilization device, identical reference symbols once again designating elements which are identical or correspond to those in FIGS. 1 to 4, for which reason a repeated description is dispensed with below. In accordance with FIG. 5, the patterned mask 1 has already been integrated into the bottom of the carrier plate 9 and the workpiece or the thin wafer 11 is introduced with its rear side to be implanted toward the bottom. From above, with the possibilities illustrated in FIG. 3 or 4, the workpiece 11 is thereupon closed off over the whole area and held in such a way that the edges or peripheral regions are subjected to minimal loading, for a processing such as, for example, an implantation I is once again effected from the side of the patterned mask 1.

The dimensions of the carrier plate 9 going beyond the thin wafer 11 are illustrated by dashed lines, whereby an arbitrary size adaptation to a respective handling apparatus is indicated.

The workpiece to be processed, which may include a thin wafer but also a semiconductor wafer of normal thickness or a carried thin wafer, is placed into the stabilization device and closed off either manually or by an automatic machine constructed for automatic component mounting. With the aid of a handling system e.g. internally in the implantation apparatus, the stabilization device can thereupon be loaded with the workpiece to be processed, implanted and unloaded again. Finally, the processed or implanted wafer or the workpiece is removed from the stabilization device again manually or automatically and the stabilization device is, if appropriate, cleaned and used anew. The costs can be reduced further by virtue of this repeated usability of the stabilization device.

The stabilization device has been described above on the basis of an ultra thin semiconductor wafer to be implanted. However, it is not restricted thereto and encompasses in the same way arbitrary other workpieces which are at, risk of fracture and require patterned processing.

It is therefore intended that the foregoing detailed description be regarded as illustrative rather than limiting, and that it be understood that it is the following claims, including all equivalents, that are intended to define the spirit and scope of this invention.

The invention claimed is:

1. A device that stabilizes a workpiece during processing comprising:
    a first workpiece carrier part;
    a second workpiece carrier part; and
    a fixing unit configurable to mutually fix the workpiece carrier parts in such a way that the workpiece is held between the first and second workpiece carrier parts, wherein the first workpiece carrier part comprises a patterned mask, wherein the patterned mask comprises a thickness of about 10 to 250 μm.

2. The device as claimed in claim 1 wherein the second workpiece carrier part comprises a covering plate and the first workpiece carrier part comprises a carrier plate with a mask formed in an integrated fashion.

3. The device as claimed in claim 1 wherein the second workpiece carrier part comprises a carrier plate with a first depression that receives the workpiece.

4. The device as claimed in claim 1 wherein the patterned mask comprises a stencil mask film usable for an implantation.

5. The device as claimed in claim 1 wherein the workpiece is held only at opposite main surfaces.

6. The device as claimed in claim 1 wherein the fixing unit comprises an articulation.

7. The device as claimed in claim 1 wherein the fixing unit comprises at least one mechanical locking element.

8. The device as claimed in claim 1 wherein the fixing unit comprises at least one magnet element.

9. The device as claimed in claim 3 wherein the first workpiece carrier part comprises a supporting element that carries the patterned mask and the second workpiece carrier part comprises a second depression that receives the supporting element.

10. The device as claimed in claim 1 wherein openings in the mask are formed in at least one of a punctiform fashion, in a slotted fashion, in a linear fashion, in a rectangular fashion, or in a round fashion with regard to a plan view.

11. The device as claimed in claim 10 wherein the openings comprise at least one of a rectangle or a truncated cone in cross-section.

12. The device as claimed in claim 1 wherein the patterned mask comprises a metallic material, a ceramic, or a plastic.

13. The device as claimed in claim 1 wherein the workpiece comprises a thin wafer carried on a carrier wafer.

14. The device as claimed in claim 13 wherein the thin wafer has a thickness of about 140 µm.

15. An apparatus for stabilizing a workpiece during processing comprising:
   a first workpiece carrier part;
   a second workpiece carrier part; and
   means for mutually fixing the workpiece carrier pads in such a way that the workpiece is held between the first and second workpiece carrier parts, wherein the first workpiece carrier part comprises a patterned mask.

16. The apparatus as claimed in claim 15 wherein the second workpiece carrier part comprises a covering plate and the first workpiece carrier part comprises a carrier plate with an integral mask.

17. The apparatus as claimed in claim 15 wherein the second workpiece carrier part comprises a carrier plate with a first depression configured to receive the workpiece.

18. The apparatus as claimed in claim 17 wherein the first workpiece carrier part comprises a supporting means for carrying the patterned mask and wherein the second workpiece carrier part comprises a second depression configured to receive the supporting element.

19. A device that stabilizes a workpiece during processing comprising;
   a first workpiece carrier part;
   a second workpiece carrier part; and
   a fixing unit configurable to mutually fix the workpiece carrier parts in such a way that the workpiece is held between the first and second workpiece carrier parts, wherein the first workpiece carrier part comprises a patterned mask, and wherein the fixing unit comprises an articulation.

20. The device as claimed in claim 19 wherein the fixing unit comprises at least one mechanical locking element.

21. A device that stabilizes a workpiece during processing comprising:
   a first workpiece carrier part;
   a second workpiece carrier part; and
   a fixing unit configurable to mutually fix the workpiece carrier parts in such a way that the workpiece is held between the first and second workpiece carrier parts, wherein the first workpiece carrier part comprises a patterned mask, wherein the patterned mask comprises a metallic material, a ceramic, or a plastic.

* * * * *